(12) United States Patent
Jarrett et al.

(10) Patent No.: US 9,448,872 B2
(45) Date of Patent: Sep. 20, 2016

(54) HARDWARE STATE DATA LOGGER FOR SILICON DEBUG

(71) Applicant: Apple Inc., Cupertino, CA (US)

(72) Inventors: Ben D. Jarrett, Austin, TX (US); Fritz A. Boehm, Dripping Springs, TX (US)

(73) Assignee: Apple Inc., Cupertino, CA (US)

( * ) Notice: Subject to any disclaimer, the term of this patent is extended or adjusted under 35 U.S.C. 154(b) by 277 days.

(21) Appl. No.: 14/179,191

(22) Filed: Feb. 12, 2014

(65) Prior Publication Data

US 2015/0227410 A1    Aug. 13, 2015

(51) Int. Cl.
  *G06F 17/50*    (2006.01)
  *G06F 11/07*    (2006.01)
  *G01R 31/317*   (2006.01)
  *G06F 11/22*    (2006.01)

(52) U.S. Cl.
  CPC ..... *G06F 11/0778* (2013.01); *G01R 31/31705* (2013.01); *G06F 11/22* (2013.01)

(58) Field of Classification Search
  USPC ........................................................ 716/136
  See application file for complete search history.

(56) References Cited

U.S. PATENT DOCUMENTS

| 6,839,873 B1* | 1/2005 | Moore ............ G01R 31/31701 326/38 |
| 8,799,715 B2 | 8/2014 | Gulati et al. |
| 2005/0154552 A1* | 7/2005 | Stroud ............... G01R 31/2882 702/120 |
| 2008/0036488 A1* | 2/2008 | Kelem ................ G06F 15/7867 326/10 |
| 2011/0307750 A1* | 12/2011 | Narayanan ..... G01R 31/318547 714/729 |
| 2014/0002136 A1* | 1/2014 | Greene ................ H03K 19/052 326/93 |
| 2015/0046763 A1 | 2/2015 | Makar et al. |
| 2015/0293172 A1 | 10/2015 | Bhargava |

OTHER PUBLICATIONS

Ramsay, et al., U.S. Appl. No. 14/693,116, entitled "Serial Wire Debug Bridge", filed Apr. 22, 2015, 22 pages.

* cited by examiner

*Primary Examiner* — Mohammed Alam
(74) *Attorney, Agent, or Firm* — Rory D. Rankin; Meyertons, Hood, Kivlin, Kowert & Goetzel, P.C.

(57) ABSTRACT

Systems and methods of utilizing a hardware state data logger to debug in silicon. One or more hardware state data loggers are incorporated into a circuit design and fabricated along with the functional units of the circuit into a fabricated chip. When a problem is encountered during testing of the fabricated chip, a hardware state data logger is enabled to capture and store with a final sequence of events that led to the error. The stored data is then extracted from the fabricated chip and used to determine the underlying cause of the failure.

19 Claims, 11 Drawing Sheets

HARDWARE STATE DATA LOGGER FOR SILICON DEBUG

BACKGROUND

1. Field of the Invention

The present invention relates generally to systems on chips, and in particular to techniques for debugging fabricated systems on chips.

2. Description of the Related Art

Systems on chips (SoCs) continue to grow in complexity as increasing numbers of transistors are incorporated into SoCs. SoC implementations can include one or more processors and a variety of peripherals, all integrated onto one semiconductor substrate. The peripherals can be in various states of operation at the same time that the processor(s) are executing any number of software processes. The number of possible states in the SoC, all of which must generally provide correct operation, increases exponentially with this additional complexity. Large numbers of possible states of the SoC are typically tested and verified during the design and manufacture of the SoC to provide reasonable assurance that the design is correct and that the SoC will function as designed.

Many stages of simulation may be performed to verify the SoC design before the actual SoC is fabricated in silicon. After fabrication of the SoC, additional testing is performed to ensure proper operation. Conventional approaches for hardware debugging of silicon are inadequate and inefficient. For example, a scan chain of registers (or flip-flops) is often included in a SoC design to aid in the debugging process of a fabricated SoC. When a problem is encountered, the current state of the SoC can be scanned out of the SoC by performing a scan dump operation. However, this usually does not provide enough information to debug the problem. The engineers debugging the SoC can try re-running a test and doing successive scan dumps. However, this can create lots of superfluous data and may not capture the problem if the system timing is different between successive scan dumps. For example, 100 scan dumps may be performed on the final 100 cycles before an error occurs. Each one of these 100 scan dumps might see different system level timing such that the dump from cycle 50 may not be fully coherent with cycle 51. Additionally, it may not be possible to dump the last 100 cycles successfully if a design takes hours to lock-up and it is not possible to predict when a lock-up will occur.

SUMMARY

Various embodiments of systems and methods for utilizing a hardware state data logger to aid in debugging circuits in silicon are contemplated.

In one embodiment, one or more hardware state data loggers may be added to a circuit design so as to aid in debugging the circuit design when the circuit design is fabricated in actual silicon. The hardware state data loggers may be located so as to debug specific interfaces, state machines, or other particular logic. The hardware state data loggers may also have a programmable trigger for capturing data. The hardware state data loggers may be fully passive to other functional logic.

In one embodiment, the data captured by a hardware state data logger may be stored in a memory device that is utilized by other functional units. For example, in one embodiment, the data captured by the hardware state data logger may be stored in a processor's level one (L1) cache. The L1 cache may be utilized as a pointer-based (first-in first-out) FIFO queue which rolls over as capacity is exceeded. It is noted that functionality may not be affected by using the L1 cache but there may be some degradation in performance.

In one embodiment, an error may occur during testing of a system on chip (SoC). For example, the SoC may include a graphics processor, and the graphics processor may stall or malfunction in certain scenarios. The hardware state data logger may be located so as to passively listen in on a bus interface of the graphics processor. The hardware state data logger may capture bus transactions on the graphics processor bus interface and store these bus transactions in a memory device on the SoC. When the graphics processor malfunction occurs, the last N bus transactions leading up to the malfunction may be stored in the memory device, wherein the number 'N' is determined by the capacity of the memory device. The N bus transactions may then be extracted from the memory device to aid in debugging the cause of the graphics processor malfunction.

These and other features and advantages will become apparent to those of ordinary skill in the art in view of the following detailed descriptions of the approaches presented herein.

BRIEF DESCRIPTION OF THE DRAWINGS

The above and further advantages of the methods and mechanisms may be better understood by referring to the following description in conjunction with the accompanying drawings, in which.

DETAILED DESCRIPTION OF EMBODIMENTS

Figure 1:
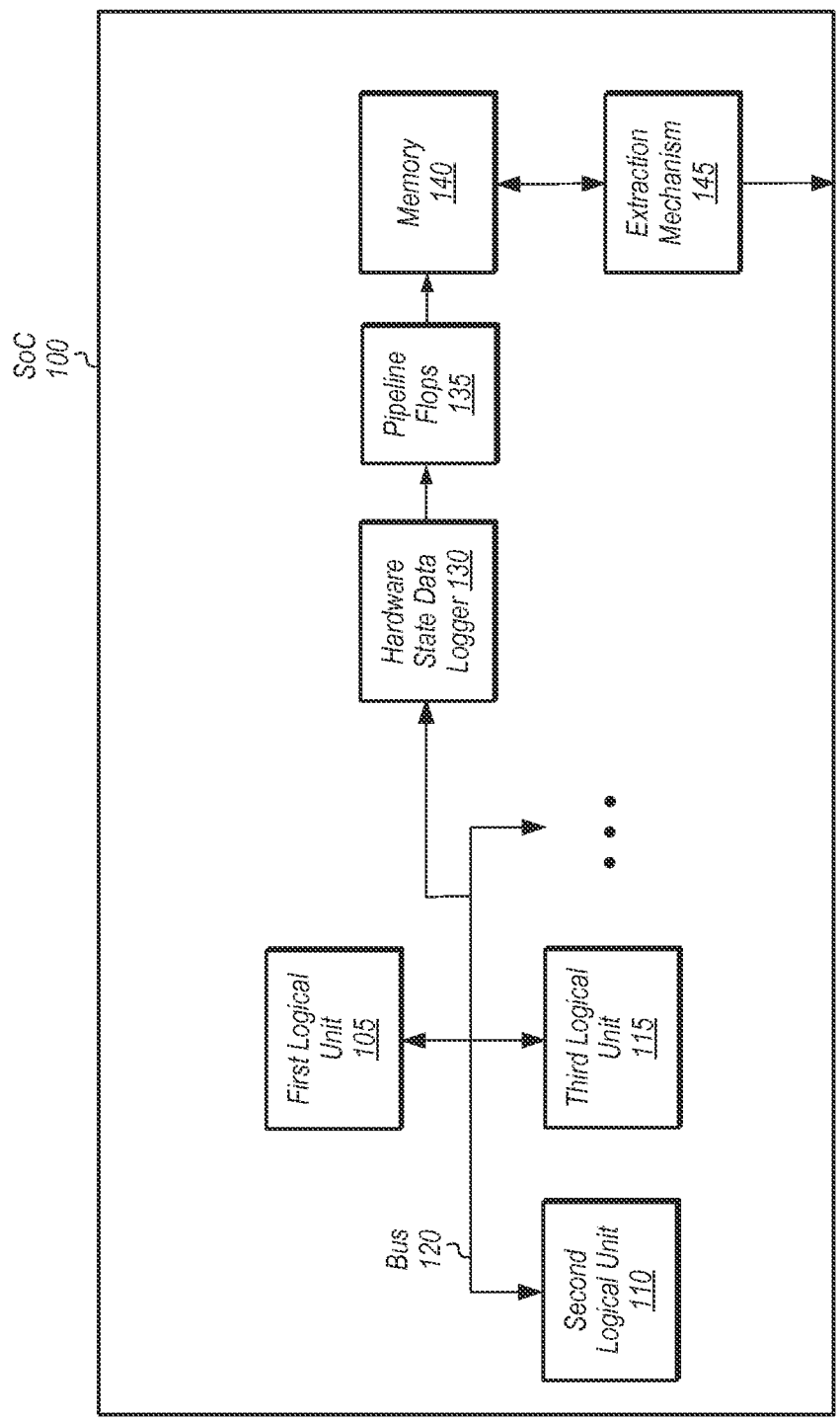
FIG. 1 is a block diagram illustrating one embodiment of a SoC including a hardware state data logger.

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

This specification includes references to "one embodiment". The appearance of the phrase "in one embodiment" in different contexts does not necessarily refer to the same embodiment. Particular features, structures, or characteristics may be combined in any suitable manner consistent with this disclosure. Furthermore, as used throughout this application, the word "may" is used in a permissive sense (i.e., meaning having the potential to), rather than the mandatory sense (i.e., meaning must). Similarly, the words "include", "including", and "includes" mean including, but not limited to.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "A system comprising a hardware state data logger . . . . " Such a claim does not foreclose the system from including additional components (e.g., CPU, GPU, memory device).

"Configured To." Various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., a field programmable gate array (FPGA) or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, in a SoC having five logical units, the terms "first" and "second" logical units can be used to refer to any two of the five logical units.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

Referring now to FIG. 1, a block diagram of one embodiment of a SoC 100 including a hardware state data logger 130 is shown. SoC 100 may include various functional logic units, including first logical unit 105, second logical unit 110, and third logical unit 115 coupled together via bus 120. These logical units are representative of any number of units and/or components which are configured to perform the functions of SoC 100 during normal, non-debug related operations. Hardware state data logger 130 may be located such that it can passively read data traversing bus 120. For example, in one embodiment, hardware state data logger 130 may trigger on the bus valid signal to capture the state of bus 120.

During normal operation of the fabricated SoC 100, hardware state data logger 130 may be disabled by being power-gated or clock-gated. However, when testing of the fabricated SoC 100 results in one or more errors, hardware state data logger 130 may be enabled to capture data from bus 120 to aid in the debugging process. Hardware state data logger 130 may then send the captured data to memory 140 via pipeline flops 130. Memory 140 may be any type of memory device within SoC 100. In one embodiment, memory 140 may be dedicated to hardware state data logger 130 and may only store data captured by hardware state data logger 130. In other embodiments, memory 140 may store data associated with one or more functional units during normal operation, but memory 140 may be repurposed for storing data captured by hardware state data logger 130 when SoC 100 is in debug mode.

In the various tests and debug operations executed on SoC 100, hardware state data logger 130 may be configured to operate at the target speed of SoC 100. In order to meet the timing of sending data to memory 140, pipeline flops 130 may be used to relay the data to memory 140. Alternatively, when recreating a test to recreate a given error, SoC 100 may be run at a lower speed and the captured data may be routed to the memory device without using pipeline flops 130.

Hardware state data logger 130 may be a non-intrusive, passive device, and may be strategically located within SoC 100 to have access to devices and interfaces which might need to be debugged after SoC 100 is fabricated into an actual silicon chip. Hardware state data logger 130 may then be disabled once SoC 100 has been validated in silicon. However, during a debug phase, hardware state data logger 130 may be enabled to capture data associated with one or more functional circuits. After being enabled, hardware state data logger 130 may automatically collect data on a continuous basis and store the data in memory 140. Accordingly, hardware state data logger 130 may overwrite old data with new data when memory 140 overflows. In this way, hardware state data logger 130 may store the most recent information regarding one or more functional circuits which may prove to be useful in debugging when a malfunction occurs and the status of the functional circuits can be analyzed using this captured data.

In certain situations, the standard debug tools (e.g., logic analyzer, software probe) may lose visibility into the fabricated SoC 100 when failures occur. In these situations, hardware state data logger 130 may be the only tool available to help determine the cause of the malfunction. Additionally, the data stored in memory 140 by hardware state data logger 130 may not be retrievable using traditional methods when malfunctions occur. Therefore, extraction mechanism 145 may be configured to extract data from memory 140 when the rest of SoC 100 is locked up or malfunctioning. Any of various extraction circuits or techniques may be utilized to extract the captured data from memory 140. For example, in one embodiment, extraction mechanism 145 may be a scan chain of flip-flops. In some cases, extraction mechanism 145 may commandeer circuits, registers, or other logic that have a different purpose within the design but which may be repurposed during the debug phase to extract captured debug data In various embodiments, SoC 100 may also be referred to as an integrated circuit (IC) or as an application specific integrated circuit (ASIC). SoC 100 may be utilized in a variety of end products, such as cell phones, smartphones, tablets, electronic reading devices, computers, servers, televisions, set-top boxes, video game consoles, and various other products.

Figure 2:
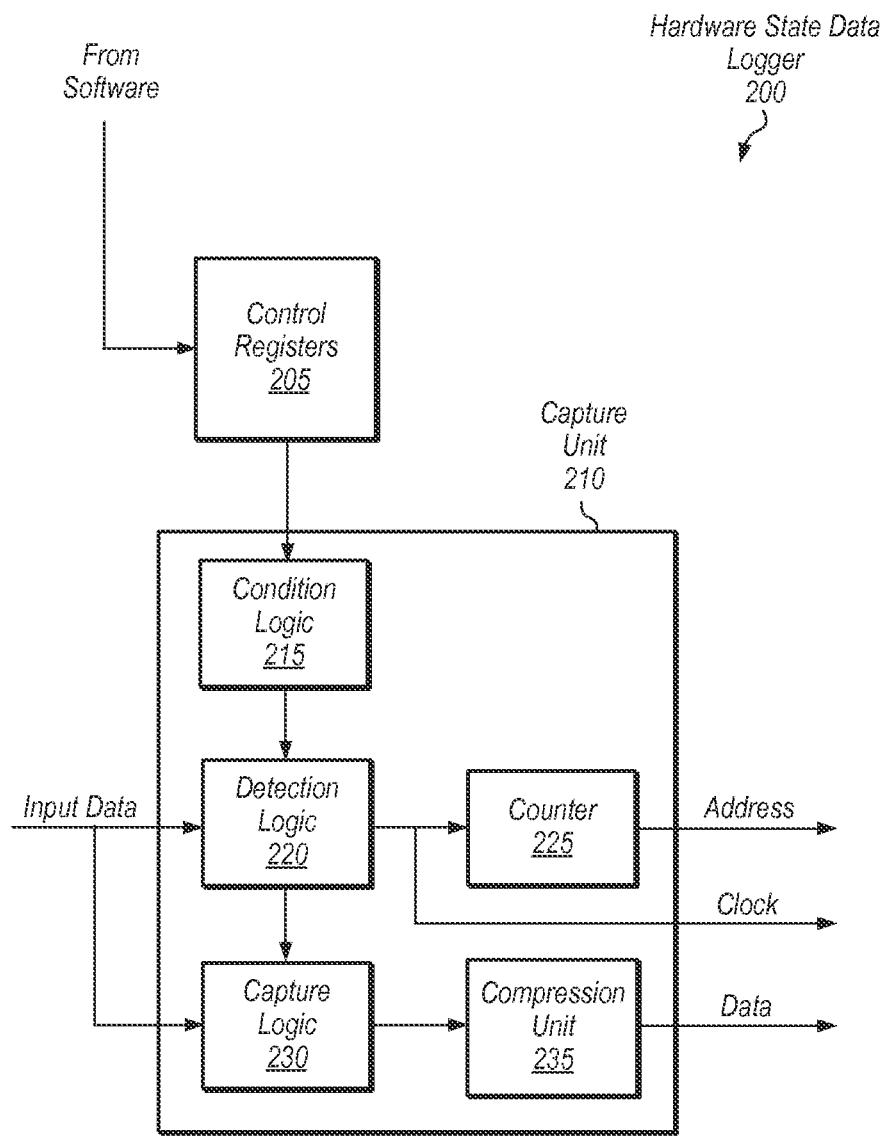
FIG. 2 is a block diagram illustrating one embodiment of a hardware state data logger.

Turning now to FIG. 2, a block diagram of one embodiment of a hardware state data logger 200 is shown. Hardware state data logger 200 may include control registers 205 and capture unit 210. Control registers 205 may be software visible and may be written to by software executing on a central processing unit (CPU) or other processing unit. Hardware state data logger 200 may be reconfigurable based on the values software writes to control registers 205. For example, the values written to control registers 205 may determine which data gets captured by capture unit 210. For example, in one embodiment, hardware state data logger 200 may be connected to a bus with four master devices connected to a slave device. The control registers 205 may determine which data corresponding to particular masters is captured by capture unit 210. Additionally, in various embodiments, control registers 205 may specify if only read transactions should be captured, if only write transactions should be captured, if only transactions targeting a specific address range should be captured, and so on.

Capture unit 210 may include steering logic to capture the desired data from the bus or connection to which hardware state data logger 200 is coupled. Capture logic 210 includes condition logic 215, which may be configured based on the values in control registers 205. Capture logic 210 also includes detection logic 220, which may detect a first condition from the received input data and trigger capture logic 230 to capture data in response to detecting this first condition, wherein the first condition is indicated by condition logic 215. For example, in one embodiment, the first condition may be a bus transaction generated by a first master. On a subsequent test, control registers 205 may be updated and condition logic 215 may be set to indicate a second condition should trigger the capturing of the input data. For this subsequent test, the detection logic 220 may detect a second condition from the received input data and trigger capture logic 230 to capture data in response to detecting this second condition. For example, in one embodiment, the second condition may be a bus transaction generated by a second master.

In some embodiments, capture unit 210 may include compression unit 235 to compress the captured data. The captured data may be compressed using any of various suitable compression techniques. Capture unit 210 may also include counter 225 which may be used to generate addresses for storing the captured data in the targeted memory device (not shown). In one embodiment, counter 225 may be an incrementing counter which rolls over when it reaches a threshold or maximum value. The value at which counter 225 rolls over may be set based on the number of available addresses in the target memory device.

When a failure occurs in the fabricated SoC, the value of counter 225 may be retrieved to determine the order in which data stored in the memory device was captured. For example, if the counter value is 0x58 when the failure occurs, then this indicates that the memory device address corresponding to counter value 0x58 has the most recent data, while the memory device address corresponding to counter value 0x59 has the oldest data. This may allow the stored data to be properly analyzed by determining the order in which the data was captured.

It should be understood that the distribution of functionality illustrated in FIG. 2 is not the only possible arrangement of circuitry which may be utilized for a hardware state data logger. Other hardware state data loggers may include other logic, omit one or more of the components shown, and/or include a different arrangement of functionality among the components and other logic.

Figure 3:
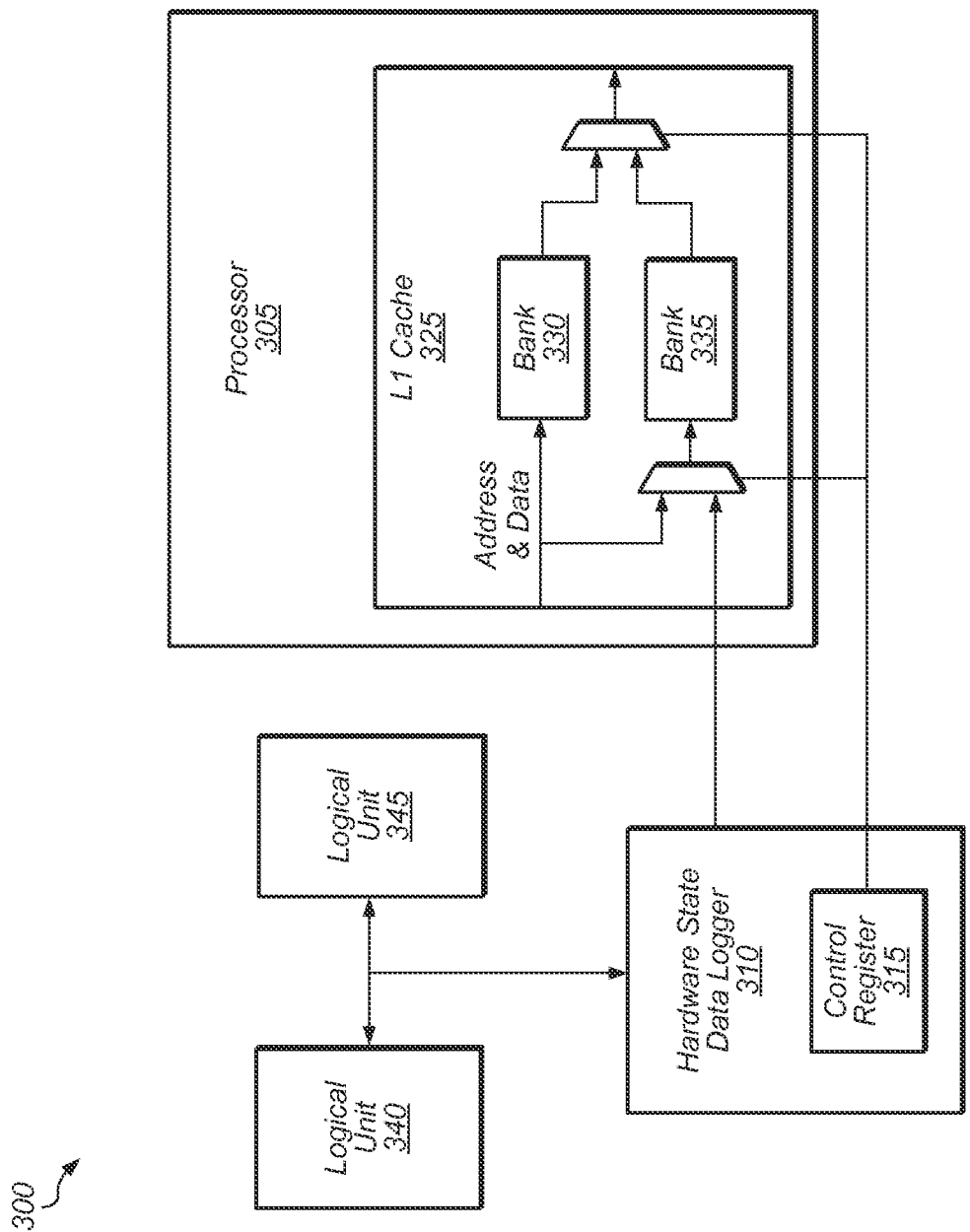
FIG. 3 is a block diagram illustrating one embodiment of a hardware state data logger in an IC.

Referring now to FIG. 3, a block diagram of one embodiment of a hardware state data logger 310 in an integrated circuit (IC) 300 is shown. Integrated circuit 300 may include processor 305, hardware state data logger 310, and logical units 340 and 345. Integrated circuit 300 may also include various other components and logical units, depending on the embodiment. Processor 305 may include L1 cache 325, which may be utilized to store data utilized by processor 305. Processor 305 may also include other logic, including execution units, fetch units, and various other units of a processor pipeline.

In normal operation of processor 305, both bank 330 and bank 335 of L1 cache 325 may be utilized for storing data retrieved from system memory (not shown) or other caches (not shown) by processor 305. During debug mode, when hardware state data logger 310 is capturing data from the interface between logical units 340 and 345, this captured data may be stored in bank 335. For example, a given error may be detected while testing IC 300, and the cause of the given error may be difficult to determine using software tools and other traditional debugging tools. Therefore, the test software may be modified to use only bank 330 of L1 cache 325 during the testing of IC 300, and then the same test may be rerun. If the same given error is encountered when only bank 330 of L1 cache 325 is being used, then another test may be executed, this time with hardware state data logger 310 enabled to capture data and store the data in bank 335, which is being repurposed as a storage unit for captured debug data. For example, in one embodiment, hardware state data logger 310 may capture a plurality of bus transactions on the interface between logical units 340 and 345, and then store these in bank 335. When the given error is detected, the last 'N' bus transactions may be extracted from bank 335 of L1 cache 325 and out of IC 300, wherein 'N' is determined by the size of bank 335 and the amount of data in each bus transaction. These N bus transactions may then be analyzed to help determine the cause of the given error. This may aid significantly in the debug process of IC 300 and reduce the amount of time needed to verify the correct operation of IC 300. While the comments above describe the use of a single bank 335, it is noted that in various embodiments any desired selection of one or more banks may be utilized with the approaches described herein.

Figure 4:
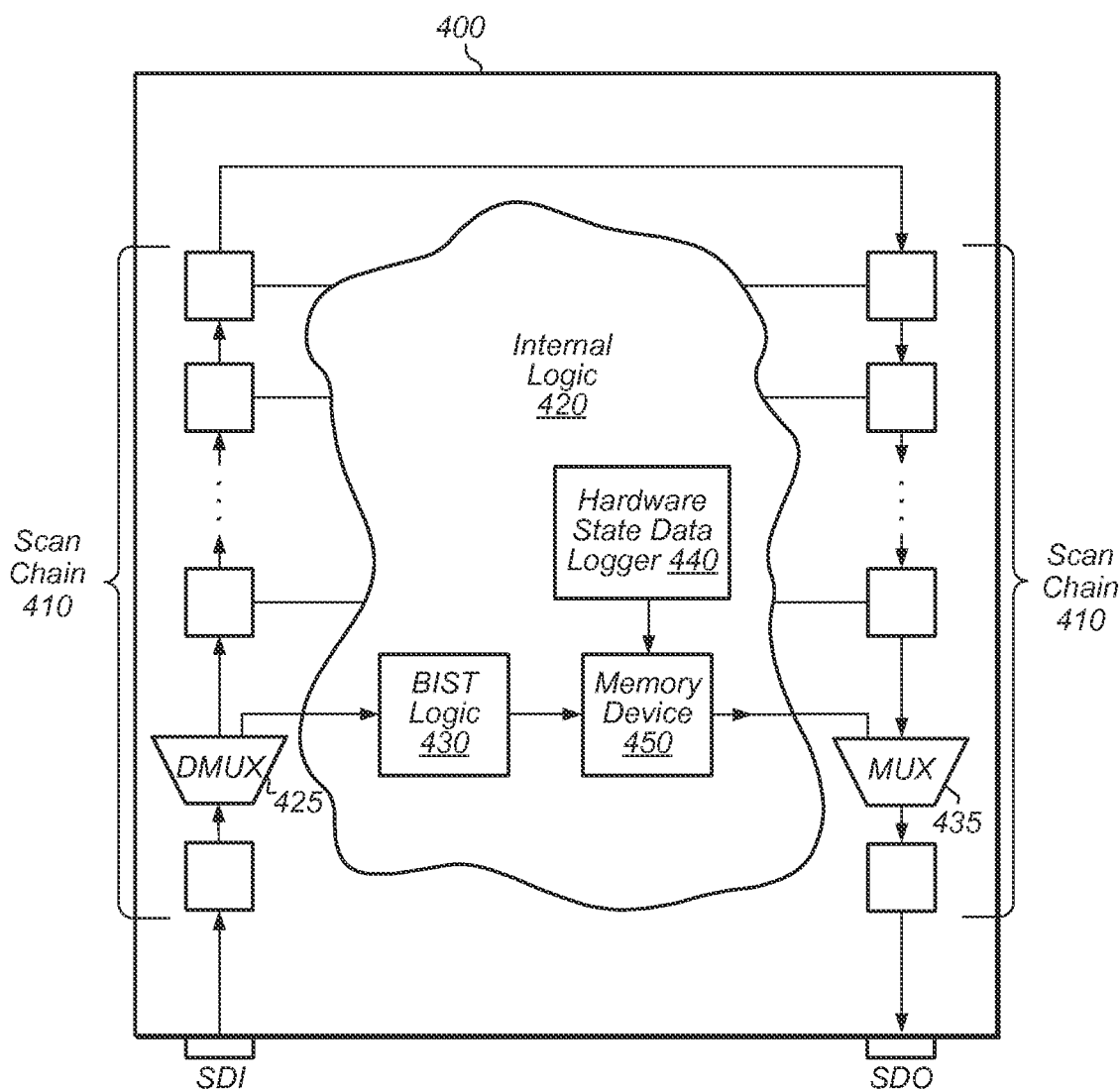
FIG. 4 is a block diagram illustrating one embodiment of a fabricated SoC with a scan chain of flip-flops.

Turning now to FIG. 4, a block diagram of one embodiment of a fabricated SoC 400 with a scan chain of flip-flops 410 is shown. Hardware state data logger 440 may be configured to track the state of a functional unit (not shown) over a plurality of clock cycles. Hardware state data logger 440 may store data associated with these states in memory device 450, which may be any of various types of memory devices, depending on the embodiment. When a failure occurs during the debugging of fabricated SoC 400, the data associated with previous states of the functional unit(s) of SoC 400 may be useful in determining the cause of the failure. Therefore, this data may be analyzed to determine the cause of the failure.

In some cases, the failure of fabricated SoC 400 may prevent the data from being retrieved from memory device 450 using software probes or other traditional techniques. For example, a CPU may be able to read the data out of memory device 450 during normal operations, but if the CPU is locked up as a result of the detected failure, the data may be "stuck" in memory device 450, and another technique for extracting this data may be utilized.

Scan chain 410 may be typically utilized for performing scan dump operations. In one embodiment, scan chain 410 may include the pads connected to the physical pins (not shown) of SoC 400. Scan chain 410 may also include connections to flip-flops (or registers) within internal logic 420. In one embodiment, each element of scan chain 410 may be a flip-flop with data input, data output, and clock input nodes. Each element of scan chain 410 may also include a multiplexer to enable or disable scan chain mode. Scan chain 410 may be formed by coupling the scan data output of one scan element to a scan data input of a next scan element, and repeating this in a manner to form the scan chain 410. For example, in a normal scan test mode, test stimulus data may be serially shifted into SoC 400 through scan data input (SDI), from one scan element to the next (via respective element-level scan data inputs and scan data outputs) until all test stimulus data has been received at its intended scan element.

In some embodiments, scan chain 410 may also be used to extract data stored in memory device 450 when a failure of SoC 400 prevents other access to memory device 450. In one such embodiment, control data may be shifted into scan chain 410 via SDI and through demultiplexer (demux) 425 to built-in self test (BIST) logic 430. The control data may include an address of memory device 450 from which the data should be read. BIST logic 430 may be configured to read from memory device 450 as part of traditional memory testing operations. In other embodiments, other logic besides BIST logic 430 may be utilized to read from memory device 450. The data which is output from memory device 450 may pass through multiplexer (mux) 435 and to the scan data output (SDO) of scan chain 410.

In another embodiment, two or more scan chains may be utilized by SoC 400. For example, in such an embodiment, a first scan chain may include one or more data loggers while a second scan chain may exclude the one or more data loggers and be utilized for production. Multiplexers may be coupled to the scan chains and these multiplexers may be utilized to select which scan chain is utilized for a given test. By using the second scan chain for production tests, any flaws in the data logger logic will not impact yield.

Although not shown in FIG. 4, in one embodiment, the select signals for demux 425 and mux 435 may be driven by hardware state data logger 440. In another embodiment, the select signals for demux 425 and mux 435 may be controlled using other control logic (e.g., software visible registers).

Figure 5:
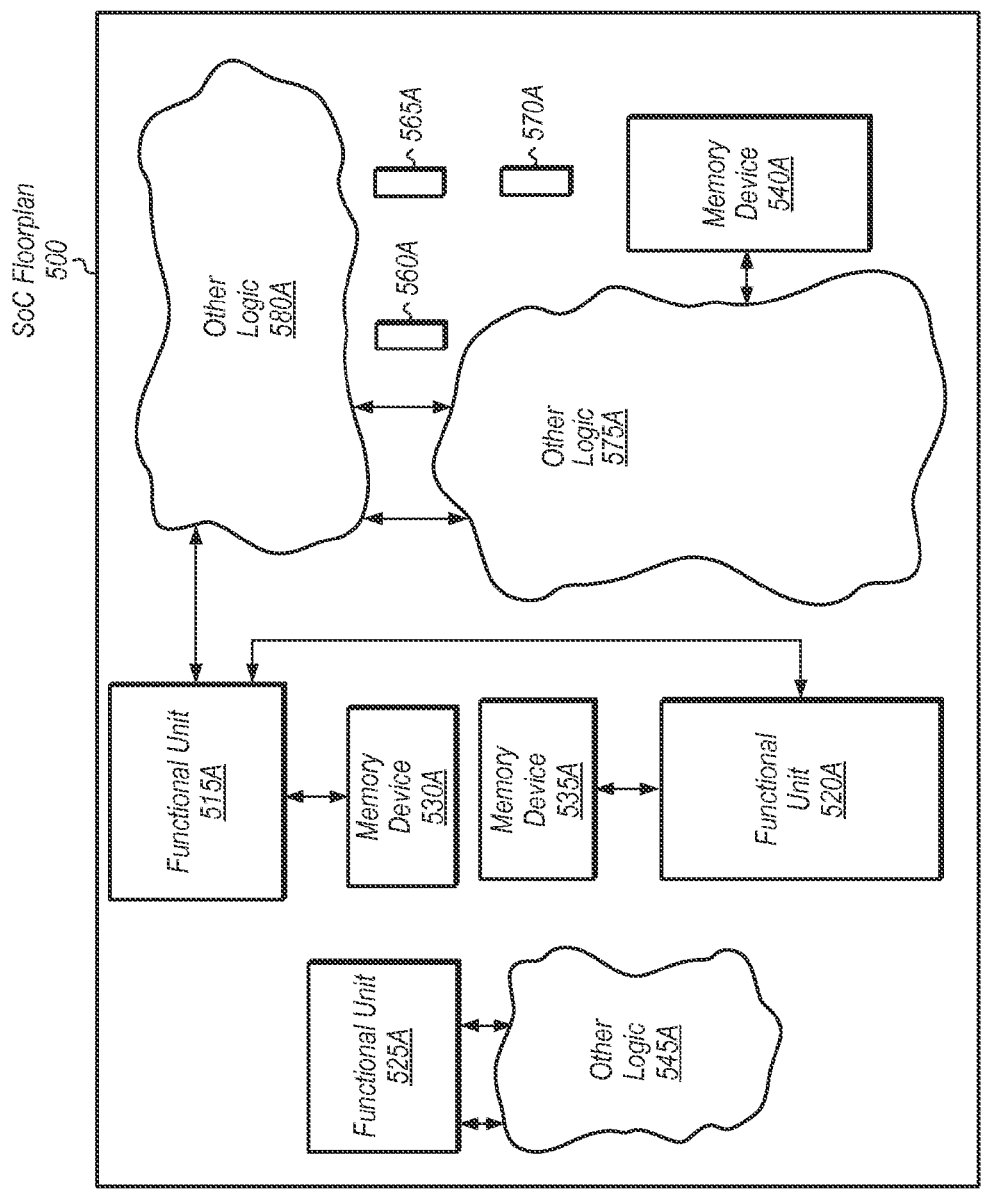
FIG. 5 is a block diagram illustrating one embodiment of a SoC floorplan.

Referring now to FIG. 5, a block diagram of one embodiment of a SoC floorplan 500 is shown. The circuitry shown in SoC floorplan 500 may be fabricated into an actual SoC based on the layout of circuit elements in SoC floorplan 500 and the connections between these circuit elements. It is noted that the fabricated SoC may also be referred to as an integrated circuit (IC), application specific integrated circuit (ASIC), chip, or otherwise.

SoC floorplan 500 may include all of the circuit elements which perform the necessary functions required of the fabricated SoC. However, the SoC floorplan 500 as shown in FIG. 5 does not yet include any hardware state data loggers. It is intended for SoC floorplan 500 to represent a floorplan prior to the insertion of hardware state data loggers.

SoC floorplan 500 includes a wide variety of circuitry, including functional units 515A, 520A, and 525A, memory devices 530A, 535A, and 540A, other logic 545A, 575A, and 580A. These units and logic may be configured to perform a variety of tasks necessary to meet all of the requirements of the target device. These units and logic may include standard processors, graphics processors, I/O devices, switch interfaces, memory devices, caches, and various other components. Other logic 545A, 575A, and 580A is representative of any type of logic, which may include some traditional test mechanisms (not shown) to aid in the debug process. These traditional test mechanisms may include built-in self test (BIST) logic, scan test logic, and/or other types of test logic.

The components shown in SoC floorplan 500 may be implemented using a silicon layer. The signal connections between components may be implemented using one or more metal layers to connect signals between components and route signals to the input/output pins of the eventual SoC. The eventual SoC may be fabricated using the silicon layer and one or more metal layers. It is noted that the relatively few signal connections shown in SoC floorplan 500 are meant to represent a much larger number of signal connections, and with more convoluted paths through the SoC floorplan 500 than what is shown. Only a few and mostly straight connections are shown in SoC floorplan 500 to avoid cluttering the figure.

The silicon layer of SoC floorplan 500 may also include spare flip-flops 560A, 565A, and 570A, which are representative of any number of spare flip-flops which may be spread throughout SoC floorplan 500 and which may be utilized on future revisions of SoC floorplan 500. By placing spare flip-flops in the silicon layer of SoC floorplan 500, the metal layers may be updated on future revisions of SoC floorplan 500 to incorporate these spare flip-flops without requiring a revision of the silicon layer. This may be advantageous since updating a silicon layer can be more time-consuming and costly than updating the metal layers.

It is noted that the corners of SoC floorplan 500 are not as crowded with components as the interior locations of SoC floorplan 500. This may generally be the case for a typical SoC floorplan, and these unoccupied corner locations may be exploited by placing additional logic for the purposes of debugging SoC floorplan 500. The techniques which may be used for inserting additional logic into SoC floorplan 500 are described as the discussion is continued for FIG. 6.

Figure 6:
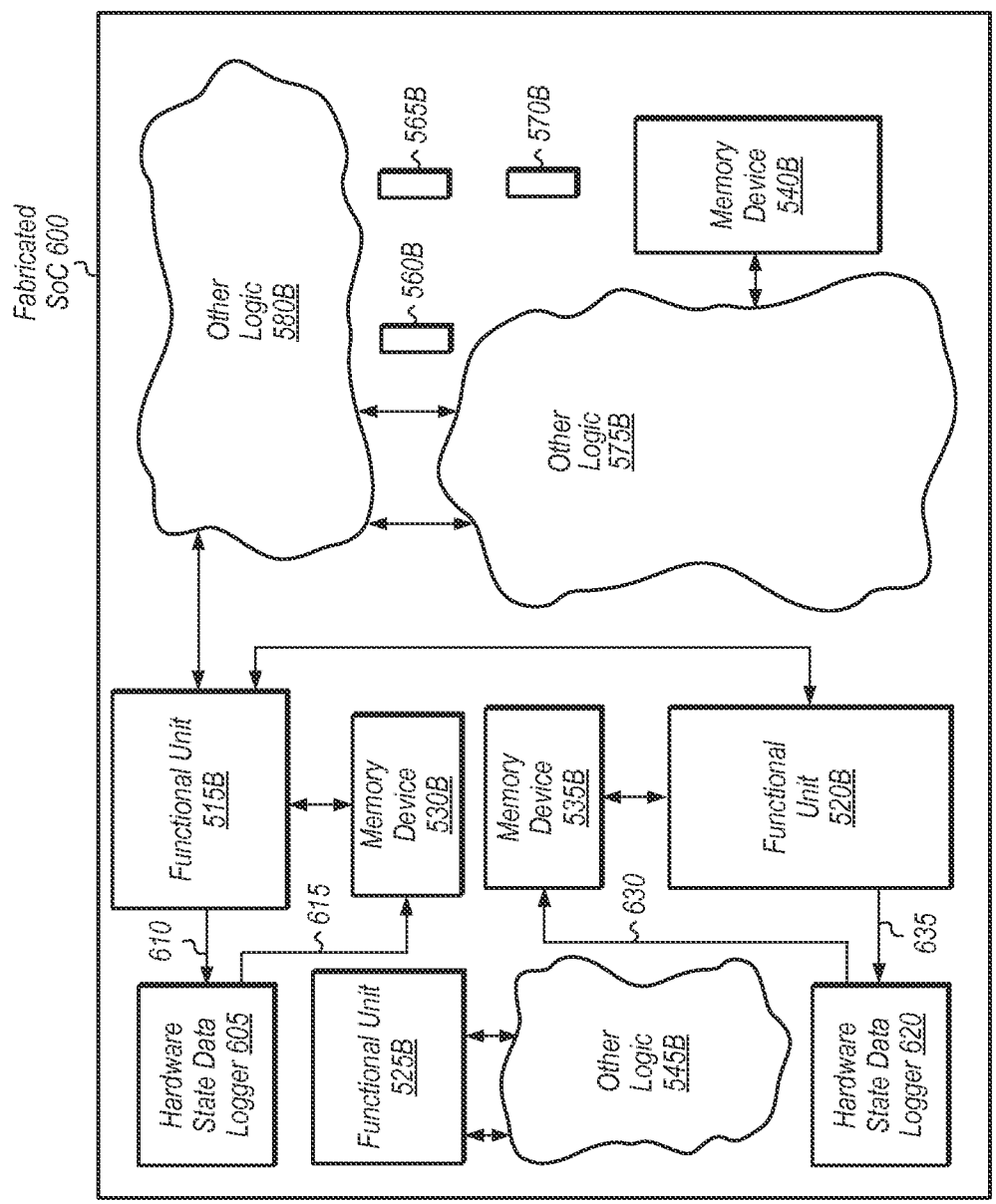
FIG. 6 is a block diagram illustrating one embodiment of a floorplan of a fabricated SoC.

Turning now to FIG. 6, a block diagram of one embodiment of a SoC floorplan 600 of a fabricated SoC is shown. SoC floorplan 600 is intended to have the same circuitry shown in SoC floorplan 500 (of FIG. 5) while including some additional logic. The components in FIG. 6, such as functional units 515B, 520B, and 525B, memory devices 530B, 535B, and 540B, other logic 545B, 575B, and 580B, and pipeline flops 560B, 565B, and 570B are the same as their counterparts in FIG. 5. In analyzing SoC floorplan 500, holes in the silicon layer of SoC floorplan 500 may be searched for with the intention of inserting hardware state data logging circuitry. As can be seen from SoC floorplan 500, there are gaps in the silicon layer in the top left corner and the bottom left corner. Therefore, these locations may be utilized for inserting hardware state data logging circuitry.

In some embodiments, the hardware state data logging circuitry may be sized and adapted to fit the available space in the silicon layer. The amount of logic and number of gates included in the hardware state data logging circuitry may also be based on the intended functional units which are to be monitored by the hardware state data logging circuitry. It may be determined which logic is likely to need additional testing and debug resources during the debug phase of the fabricated SoC in silicon. For example, if a new logical unit has been designed and not yet tested in silicon while other logical units have already been tested in other SoCs, then the new logical unit may be a more likely candidate for having connected hardware state data logging circuitry.

If the circuitry being monitored by a hardware state data logger has an 8-bit bus, then the logic may include enough gates to capture 8 bits of data per clock cycle. However, if the circuitry being monitored by the hardware state data logger has a 64-bit bus, then the logic may need additional gates to capture 64 bits of data per clock cycle. In some cases, the hardware state data logger may be placed in a location where it may potentially monitor multiple separate components.

As shown, fabricated SoC 600 includes two data loggers 605 and 620. In other embodiments, SoC 600 may have other numbers of data loggers. Data logger 605 may be connected to functional unit 515B and to memory device 530B and these connections 610 and 615 may be implemented in one or more metal layers of SoC 600. Additionally, data logger 620 may be connected to functional unit 520B and to memory device 535B and these connections 635 and 630 may be implemented in one or more metal layers of SoC 600.

SoC 600 may be fabricated and tested to determine if SoC 600 functions as intended for the purposes of its target environment. For example, in one embodiment, SoC 600 may be targeted for a smart phone or tablet device. Accordingly, a plurality of tests may be executed on the fabricated SoC 600 based on how SoC 600 will be expected to function in the smart phone or tablet device. During the plurality of tests, a failure may be detected in the operation of SoC 600. For the purposes of this discussion, it may be assumed that the error is attributed to functional unit 525B.

As shown in FIG. 6, a data logger is not connected to functional unit 525B, which may prevent the states and signals associated with functional unit 525B from being monitored in certain debug scenarios. However, in order to debug the failure associated with functional unit 525B, the metal layers of SoC 600 may be altered to connect a data logger to functional unit 525B so as to monitor its states and signals.

Figure 7:
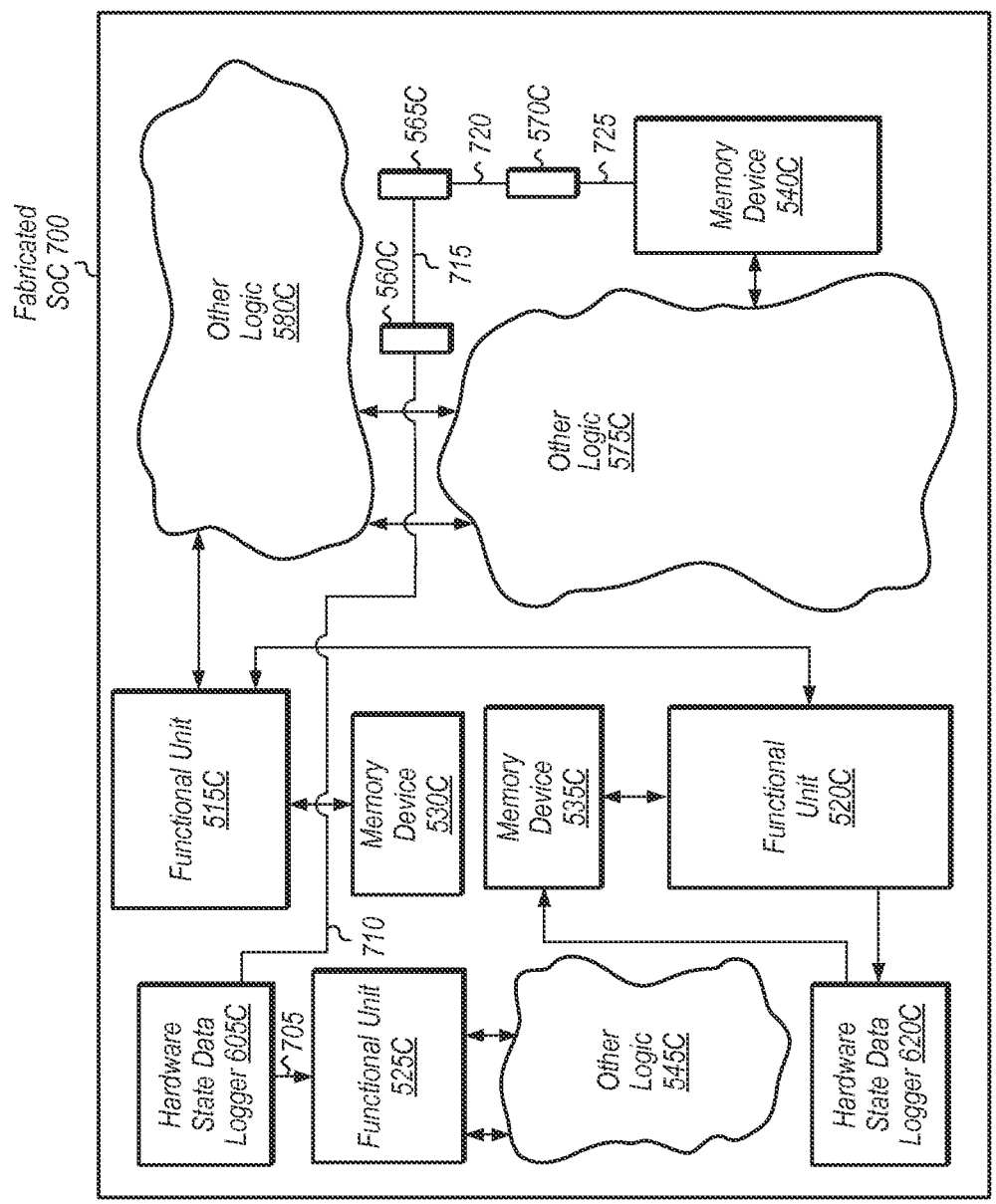
FIG. 7 is a block diagram illustrating one embodiment of a modified SoC.

Referring now to FIG. 7, a block diagram of one embodiment of a modified SoC design is shown. FIG. 7 is intended to be a continuation of the discussion regarding FIG. 6. The components in FIG. 7, such as hardware state data loggers 605C and 620C, functional units 515C, 520C, and 525C, memory devices 530C, 535C, and 540C, other logic 545C, 575C, and 580C, and pipeline flops 560C, 565C, and 570C may be the same as their counterparts in FIG. 6. After detecting the error during testing of fabricated SoC 600, a hardware state data logger near the functional unit which caused the detected error may be located. In this case, data logger 605C may be chosen as the data logger which is to be connected to functional unit 525C based on the proximity of data logger 605C to functional unit 525C. The previous connection 610 (of FIG. 6) of data logger 605 to functional unit 515B may be removed, and a new connection 705 from data logger 605C to functional unit 525C may be added to the metal layers of the design. The same silicon layer which was used to produce SoC 600 (of FIG. 6) may also be used to produce the new SoC 700. This allows SoC 700 to be reproduced more quickly and more cheaply than if the silicon layer had been changed.

It may also be assumed for the purposes of this discussion that memory device 540C will be used to store the data captured by data logger 605C. The decision to use memory device 540C rather than memory device 530C may be based on any of a variety of factors. For example, in one embodiment, it may be determined that the failure of fabricated SoC 700 prevents data from being extracted from memory device 530C. Alternatively, in another embodiment, it may be determined that memory device 540C has a larger storage capacity more suited to the amount of data being captured from functional unit 525C. In order to use memory device 540C, connections 710, 715, 720, and 725 may be added to the metal layers of the SoC design. Additionally, in order to meet the required timing on the connections from data logger 605C to memory device 540C, spare flops 560C, 565C, and 570C may be used as pipeline flops.

SoC 700 may be fabricated from the same silicon layer which was used to generate SoC 600 but with the new metal layers which include the connections 705, 710, 715, 720, and 725. The same tests which were run on SoC 600 may now be run on SoC 700 to recreate the failure of functional unit 525C. When the failure of functional unit 525C is detected, the data captured by data logger 605C and stored in memory device 540C may be extracted from SoC 700 and used to help determine the cause of the failure. Any of the various techniques described in this disclosure for extracting data may be used to extract the stored data from memory device 540C.

Figure 8:
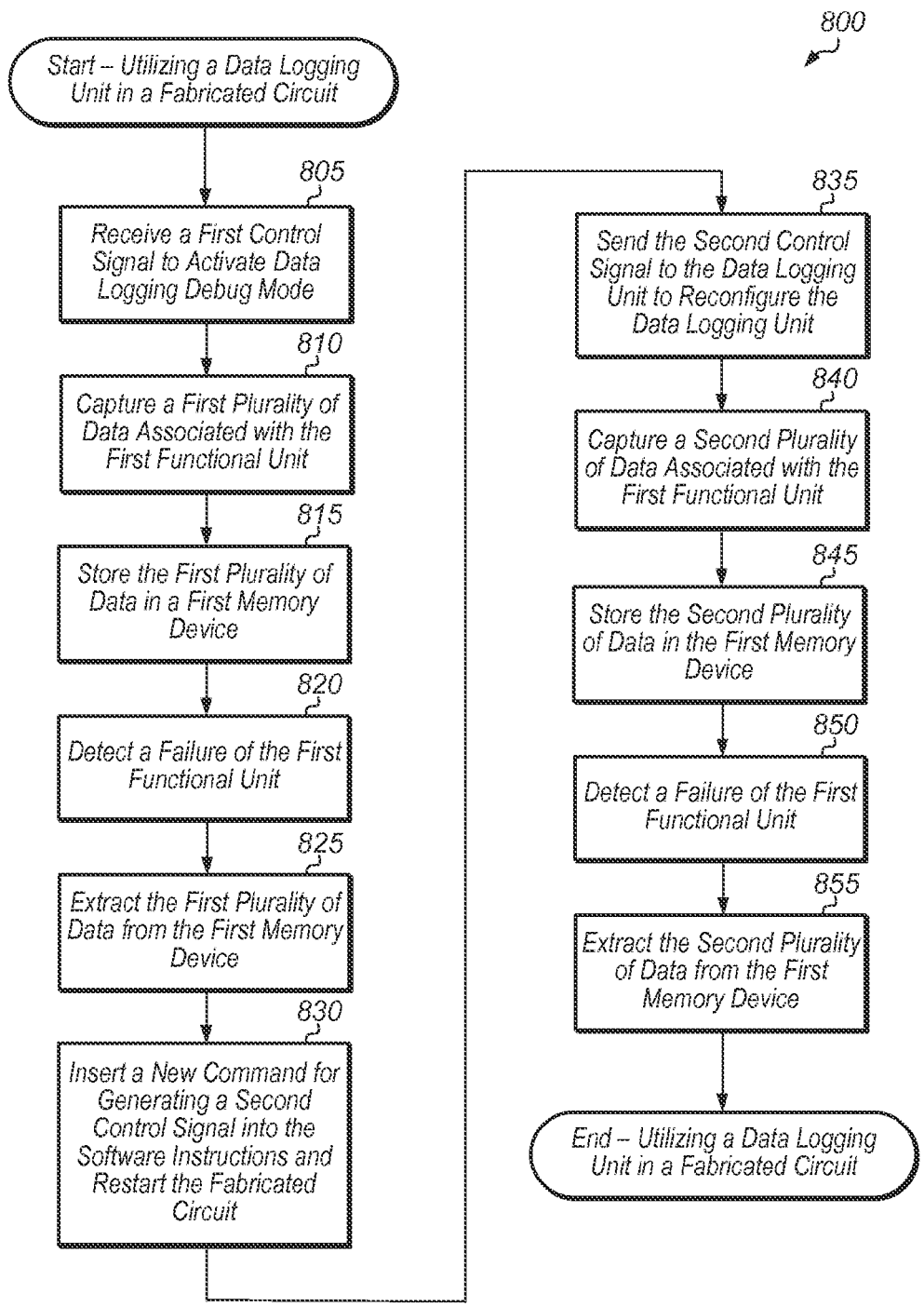
FIG. 8 is a generalized flow diagram illustrating one embodiment of a method for utilizing a data logging unit in a fabricated circuit.

Turning now to FIG. 8, one embodiment of a method 800 for utilizing a data logging unit in a fabricated circuit is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired.

A data logging unit may receive a first control signal to activate data logging debug mode (block 805). The data logging unit may be located in a fabricated circuit, such as a SoC. The data logging unit may also be coupled to a first functional unit. The data logging unit may be any of the previously described hardware state data loggers. The first control signal may specify a particular mode for the data logging unit to enter and/or may specify which data should be captured by the data logging unit. The first control signal may be generated via software executing on a processing unit of the fabricated circuit. The software may be run in order to determine if the fabricated circuit is operating as intended. In one embodiment, a fault may be detected in the operation of the first functional unit, and as a result of detecting this fault, a new command may be inserted in the software to send the first control signal to the data logging unit to activate data logging debug mode. Additionally, another command may be inserted in the software to supply power and a clock signal to the data logging unit if the data logging unit was previously in a power-gated or clock-gated mode.

In response to receiving the first control signal, the data logging unit may capture a first plurality of data associated with the first functional unit (block 810). In one embodiment, the first plurality of data may include a plurality of intermediate states of the first functional unit captured over a plurality of clock cycles. The term "intermediate states" refers to the states of the first functional unit immediately prior to the current state. In another embodiment, the data logging unit may be coupled to the first functional unit via a first bus interface, and the first plurality of data may include a plurality of bus transactions on the first bus interface. In this embodiment, the first control signal may specify that only bus transactions generated by a first master should be captured while the data logging unit is in data logging debug mode.

Next, the data logging unit may store the first plurality of data in a first memory device (block 815). In various embodiments, the first memory device may be any of various devices located in the fabricated circuit. For example, in one embodiment, the first memory device may be a processor core's L1 cache. In another embodiment, the first memory device may be another type of cache. In a further embodiment, the first memory device may be a compiled memory.

Next, a failure of the first functional unit may be detected (block 820). In response to detecting the failure, the first plurality of data may be extracted from the first memory device (block 825). In one embodiment, the data may be extracted from the first memory device using a scan chain of flip-flops. The extracted data may be used to aid in the analysis to determine what caused the failure of the first functional unit.

In some cases, it may be determined that additional information is needed to determine the cause of the failure of the first functional unit. In such cases, a new command for generating a second control signal may be inserted into the software instructions, and then the fabricated circuit may be reset and restarted (block 830). Other than the new command for generating the second control signal, the software instructions may remain the same so as to run the same test which caused the failure of the first functional unit. Then, the second control signal may be sent to the data logging unit in order to reconfigure the data logging unit for capturing a second plurality of data (block 835). The second control signal may write to one or more control registers to alter the data logging unit logic which is used for capturing data. In one embodiment, the second plurality of data may include only bus transactions generated by a second master.

In response to receiving the second control signal, the data logging unit may capture a second plurality of data (block 840). After capturing the second plurality of data, the data logging unit may store the second plurality of data in the first memory device (block 845). Then, after a failure of the first functional unit is detected (block 850), the second plurality of data may be extracted from the first memory device (block 855). This second plurality of data may then be used to help determine the cause of failure for the first functional unit. After block 855, method 800 may end.

Figure 9:
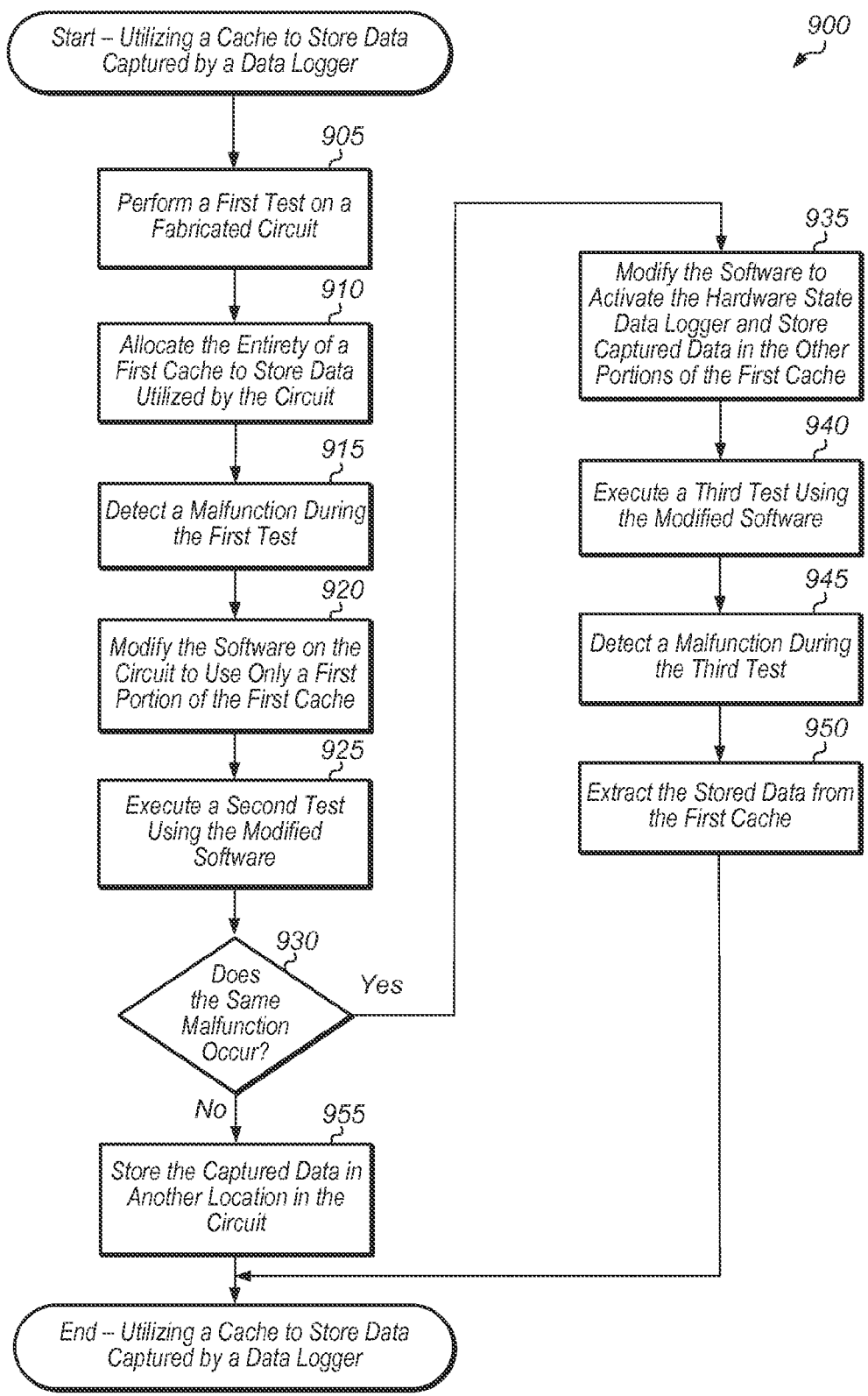
FIG. 9 is a generalized flow diagram illustrating one embodiment of a method for utilizing a cache to store data captured by a hardware state data logger.

Referring now to FIG. 9, one embodiment of a method 900 for utilizing a cache to store data captured by a hardware state data logger is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired.

A first test of a fabricated circuit may be performed (block 905). The fabricated circuit may include one or more embedded hardware state data loggers for capturing data during testing. While performing the first test, the fabricated circuit may allocate the entirety of a first cache for storing data utilized by normal operations (i.e., non-debug operations) of the fabricated circuit (block 910). In various embodiments, the first cache may be a L1 cache, level two (L2) cache, level three (L3) cache, memory controller cache, or other cache within the fabricated circuit. A malfunction may be detected in the circuit at some point during the first test (block 915). In response to detecting the malfunction, the software executing on the circuit may then be modified so that the circuit only uses a first portion of the first cache (block 920). The first portion may be a single bank, multiple banks, one half, or another size of the first cache.

Next, the circuit may execute a second test using the modified software (block 925). The purpose of the second test is to determine if the same malfunction still occurs with the circuit only using the first portion of the first cache (conditional block 930). The second test may be the same as the first test except for the circuit now using only the first portion of the first cache. The purpose of running the second test is to determine if the other portions of the first cache can be used for storing data captured by a hardware state data logger.

If the malfunction still occurs in the same manner as it did during the previous test before the software was modified (conditional block 930, "yes" leg), the software executing on the circuit may be modified to activate and configure the hardware state data logger to capture data associated with the malfunction and store the captured data in the unused portions of the first cache (block 935) For example, if the malfunction is associated with a GPU, the hardware state data logger may be configured to capture the last 'N' number of GPU bus transactions before the malfunction, wherein N is an integer determined by the available storage capacity. Next, a third test may be executed on the circuit using the modified software (block 940). After detecting the malfunction (block 945), the data captured by the hardware state data logger and stored in the first cache may be extracted and made accessible to a user for debug purposes (block 950). In one embodiment, the data may be extracted from the first cache using a scan chain of flip-flops. In other embodiments, the data may be extracted from the first cache using other suitable techniques. After block 950, method 900 may end.

If the malfunction does not occur during the second test in the same manner as it did during the first test before the software was modified (conditional block 930, "no" leg), then the captured data may be stored in another location in the circuit (block 955). In some cases, changing the software to use only a portion of the first cache may alter the operation of the circuit in a way that prevents the malfunction from being recreated. It is possible that the circuit still malfunctions but in another manner that is not equivalent to the original malfunction. After block 955, method 900 may end.

Figure 10:
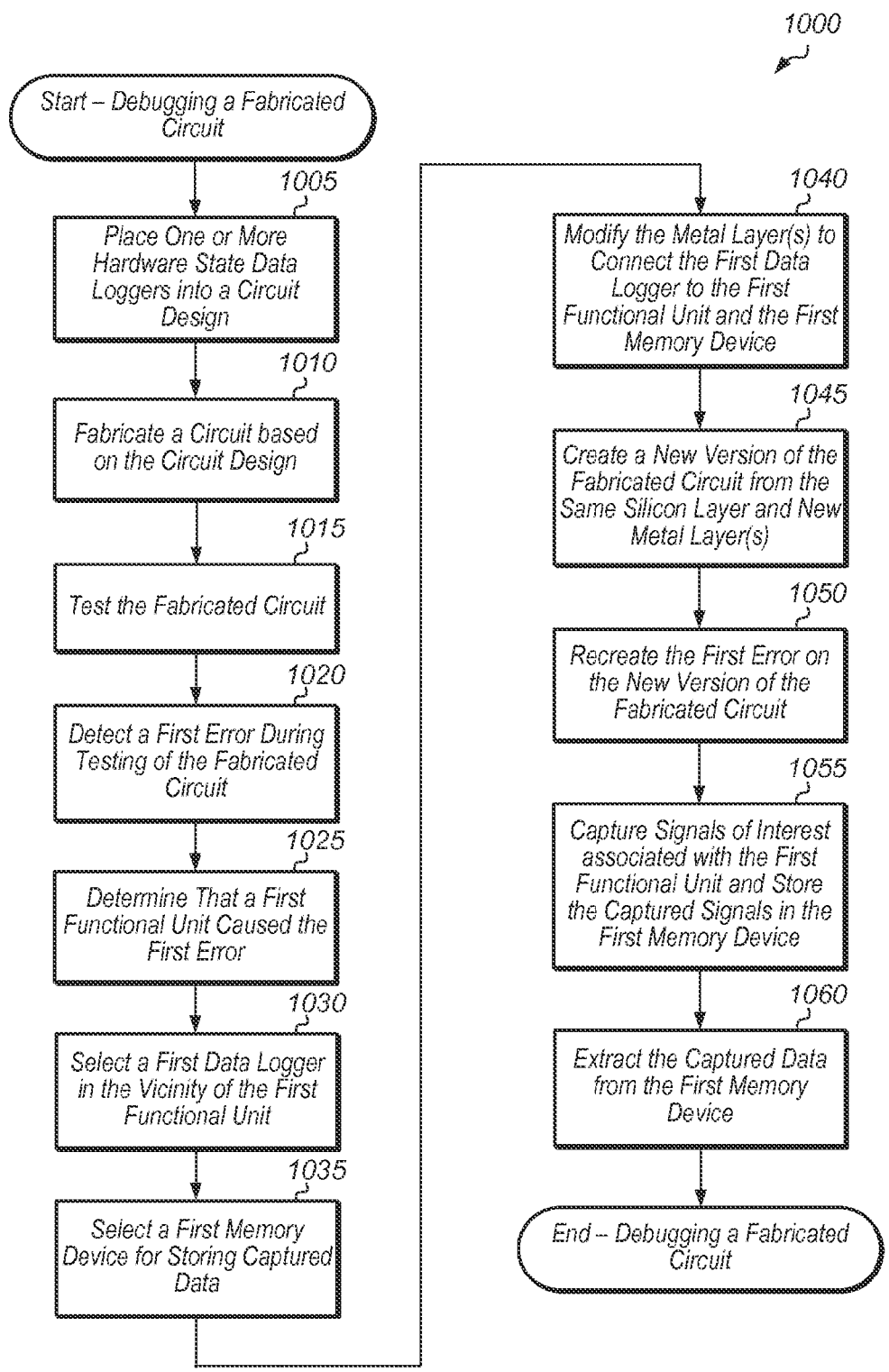
FIG. 10 is a generalized flow diagram illustrating one embodiment of a method for debugging a fabricated circuit design using embedded hardware state data loggers.

Turning now to FIG. 10, one embodiment of a method 1000 for debugging a fabricated circuit design using embedded hardware state data loggers is shown. For purposes of discussion, the steps in this embodiment are shown in sequential order. It should be noted that in various embodiments of the method described below, one or more of the elements described may be performed concurrently, in a different order than shown, or may be omitted entirely. Other additional elements may also be performed as desired.

One or more hardware state data loggers may be placed into a circuit design (block 1005). In one embodiment, the one or more hardware state data loggers may be placed throughout the circuit design in various locations without being connecting to the various functional logic units. A circuit may be fabricated based on the circuit design, with the fabricated circuit including a plurality of functional logic units and the one or more hardware state data loggers (block 1010). The fabrication may include creating the circuit from a silicon base layer and one or more metal layers.

The fabricated circuit may then be tested using a variety of different test methods (block 1015). During the testing, a first error may be detected during the operation of the fabricated circuit (block 1020). For the purposes of this discussion, it may be assumed that the cause of the first error was determined to be a first functional unit (block 1025).

Next, a first data logger in the vicinity of the first functional unit may be identified and selected (block 1030). Also, a first memory device which can be utilized to store data which the first data logger captures may also be identified and selected (block 1035). The first memory device may be any of various memory devices available on the fabricated circuit for storing captured data. If multiple memory devices are available for storing the captured data, then the first memory device may be chosen based on its location, its available storage capacity, and the ability to extract data from the first memory device after the first error has occurred.

It may be assumed for the purposes of this discussion that the first data logger is not connected to the first functional unit or to the first memory device. Therefore, the metal layers of the fabricated circuit may be modified to connect the first data logger to the first functional unit and to connect the first data logger to the first memory device (block 1040). A new version of the fabricated circuit may then be created with the same base silicon layer as the previous version but with the newly designed metal layers (block 1045). Then, the same tests may be run on the new version of the fabricated circuit to recreate the first error (block 1050). For these tests, the first data logger may capture signals of interest associated with the first functional unit and store them in the first memory device (block 1055). Next, the captured data may be extracted from the first memory device in the new version of the fabricated circuit to aid in determining the cause of the first error (block 1060). Any of the previously described techniques for extracting captured data may be utilized. After block 1060, method 1000 may end.

Figure 11:
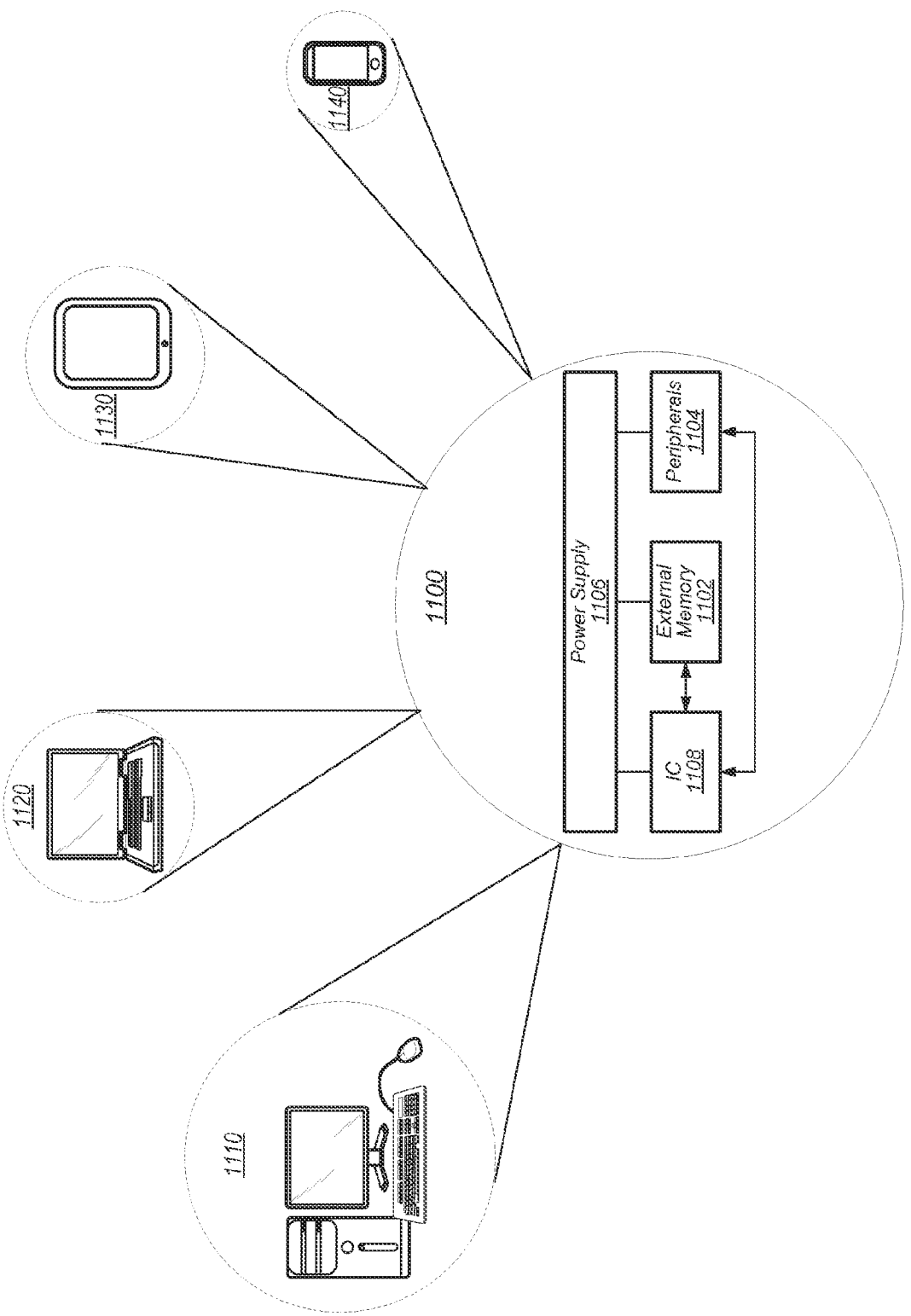
FIG. 11 is a block diagram illustrating one embodiment of a system including an IC.

Referring now to FIG. 11, a block diagram of one embodiment of a system 1100 is shown. As shown, system 1100 may represent chip, circuitry, components, etc., of a desktop computer 1110, laptop computer 1120, tablet computer 1130, cell phone 1140, or otherwise. In the illustrated embodiment, the system 1100 includes at least one instance of an IC 1108 coupled to external memory 1102. IC 1108 may be any of the previously described ICs or SoCs.

IC 1108 is coupled to one or more peripherals 1104 and the external memory 1102. A power supply 1106 is also provided which supplies the supply voltages as well as one or more supply voltages to the integrated circuit 1108, memory 1102, and/or the peripherals 1104. In other embodiments, more than one power supply 1106 may be provided. In some embodiments, more than one instance of IC 1108 may be included (and more than one external memory 1102 may be included as well).

The peripherals 1104 may include any desired circuitry, depending on the type of system 1100. For example, in one embodiment, the system 1100 may be a mobile device (e.g., personal digital assistant (PDA), smart phone, electronic reading device) and the peripherals 1104 may include devices for various types of wireless communication, such as Wi-Fi, Bluetooth, cellular, global positioning system, etc. The peripherals 1104 may also include additional storage, including RAM storage, solid state storage, or disk storage. The peripherals 1104 may include user interface devices such as a display screen, including touch display screens or multitouch display screens, keyboard or other input devices, microphones, speakers, etc. In other embodiments, the system 1100 may be any type of computing system (e.g., desktop personal computer, laptop, workstation, video game console, nettop).

The mechanisms and techniques disclosed herein can be implemented in a variety of ways including, as a system, device, method, and a computer readable medium. It is noted that the illustrated systems may comprise various forms and types of software. In one embodiment, program instructions and/or a database that represent the described systems, components, and/or methods may be stored on a computer readable storage medium. Generally speaking, a computer readable storage medium may include any non-transitory storage media accessible by a computer during use to provide instructions and/or data to the computer. For example, a computer readable storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g., synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM)), ROM, non-volatile memory (e.g. Flash memory) accessible via a peripheral interface such as the USB interface, etc. Storage media may include micro-electro-mechanical systems (MEMS), as well as storage media accessible via a communication medium such as a network and/or a wireless link.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A method comprising:
   receiving a first control signal to activate a data logging debug mode in a fabricated circuit;
   responsive to receiving the first control signal:
      capturing a first plurality of intermediate states associated with a first functional unit over a plurality of clock cycles, wherein the first functional unit is located in the fabricated circuit;
      storing the first plurality of intermediate states in a first memory device on the fabricated circuit; and
   responsive to receiving a second control signal:
      capturing a second plurality of intermediate states associated with a second functional unit of the fabricated circuit; and
      storing the second plurality of intermediate states in the first memory device;
   extracting the stored first plurality of intermediate states from the fabricated circuit after a first failure of the first functional unit is detected.

2. The method as recited in claim 1, wherein the first memory device is a cache.

3. The method as recited in claim 2, wherein the cache is a level one (L1) cache of a first processor core.

4. The method as recited in claim 3, further comprising:
   utilizing a first portion of the L1 cache for storing the first plurality of intermediate states; and
   utilizing a second portion of the L1 cache to store data associated with the first processor core.

5. The method as recited in claim 1, wherein the stored first plurality of intermediate states are extracted from the fabricated circuit using a scan chain of flip-flops.

6. The method as recited in claim 1, further comprising:
maintaining a counter for generating addresses of locations in the first memory device for storing the first plurality of intermediate states;
extracting a final counter value from the fabricated circuit responsive to detecting the first failure of the first functional unit.

7. The method as recited in claim 1, wherein prior to storing the first plurality of intermediate states in the first memory device, the method further comprising compressing the first plurality of intermediate states.

8. A system comprising:
a first functional logic unit of a fabricated circuit;
a hardware state data logger; and
a first memory device;
wherein the hardware state data logger is configured to:
receive a first control signal to activate a data logging debug mode, and responsive to receiving the first control signal:
capture a first plurality of bus transactions associated with the first functional logic unit; and
store the first plurality of bus transactions in the first memory device;
receive a second control signal which identifies a second functional logic unit, and responsive to receiving the second control signal:
capture a second plurality of bus transactions on the first bus interface, wherein the second plurality of bus transactions includes only bus transactions originating from the second functional logic unit; and
store the second plurality of bus transactions in the first memory device;
wherein the first memory device is configured to output the stored first plurality of bus transactions from the fabricated circuit after a first failure of the first functional logic unit is detected.

9. The system as recited in claim 8, wherein the first plurality of bus transactions are captured from a first bus interface.

10. The system as recited in claim 9, wherein the first control signal identifies the first functional logic unit, and wherein responsive to receiving the first control signal, the hardware state data logger is configured to capture only bus transactions originating from the first functional logic unit.

11. The system as recited in claim 8, further comprising a second functional logic unit, wherein the second functional logic unit is configured to extract the stored first plurality of bus transactions from the fabricated circuit after a failure of the first functional logic unit is detected.

12. The system as recited in claim 9, wherein the second functional logic unit comprises built-in self test (BIST) logic.

13. The system as recited in claim 12, wherein the second functional logic unit further comprises a scan chain of flip-flops.

14. A circuit comprising:
a first logical unit;
a data logging unit, wherein the data logging unit is coupled to the first logical unit; and
a first memory device, wherein the first memory device is coupled to the data logging unit;
wherein the data logging unit is configured to:
receive a first command to trigger on a first condition;
responsive to detecting the first condition:
capture a first plurality of data associated with a first functional unit;
store the first plurality of data in a first memory device;
receive a second command to trigger on a second condition;
responsive to detecting the second condition
capture a second plurality of data associated with a second functional unit; and
store the second plurality of data in the first memory device.

15. The circuit as recited in claim 14, wherein the first plurality of data is captured from a first bus interface over a plurality of clock cycles.

16. The circuit as recited in claim 15, wherein the first condition is a second logical unit sending data to the first logical unit on the first bus interface.

17. The circuit as recited in claim 16, wherein the second condition is a third logical unit sending data to the first logical unit on the first bus interface.

18. The circuit as recited in claim 17, wherein the first logical unit comprises a processor, wherein the processor comprises a cache, and wherein the first plurality of data and second plurality of data are stored in the cache.

19. The circuit as recited in claim 18, wherein the cache is a level one (L1) cache.

* * * * *